(12) United States Patent
Deguchi

(10) Patent No.: US 10,422,592 B2
(45) Date of Patent: Sep. 24, 2019

(54) DOUBLE-SIDED COOLER

(71) Applicant: TOYOTA JIDOSHA KABUSHIKI KAISHA, Toyota-shi, Aichi (JP)

(72) Inventor: Masataka Deguchi, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/785,862

(22) Filed: Oct. 17, 2017

(65) Prior Publication Data
US 2018/0142968 A1 May 24, 2018

(30) Foreign Application Priority Data

Nov. 21, 2016 (JP) .................................. 2016-226256

(51) Int. Cl.
| | | |
|---|---|---|
| *F28F 13/12* | (2006.01) | |
| *H01L 23/473* | (2006.01) | |
| *H01L 25/07* | (2006.01) | |
| *H01L 25/11* | (2006.01) | |
| *H01L 23/367* | (2006.01) | |
| *H01L 21/48* | (2006.01) | |

(52) U.S. Cl.
CPC ............ *F28F 13/12* (2013.01); *H01L 23/473* (2013.01); *H01L 23/4735* (2013.01); *H01L 25/072* (2013.01); *H01L 25/117* (2013.01); *H01L 21/4882* (2013.01); *H01L 23/3672* (2013.01); *H01L 2224/33* (2013.01)

(58) Field of Classification Search
CPC ....... F28F 13/12; H01M 10/60; H01L 23/473; H01L 25/072; H01L 25/117; H01L 23/4735; H01L 21/4882; H01L 23/3672; H01L 2224/33
USPC ........................................................ 165/80.4
See application file for complete search history.

(56) References Cited

U.S. PATENT DOCUMENTS

| | | | | |
|---|---|---|---|---|
| 5,553,394 A | * | 9/1996 | Cosley ................ | H01L 23/4735 239/524 |
| 7,571,759 B2 | * | 8/2009 | Inagaki ................ | F28D 1/0325 165/166 |
| 8,547,697 B2 | * | 10/2013 | Fukutani .............. | H01L 25/072 165/80.4 |

(Continued)

FOREIGN PATENT DOCUMENTS

| | | | |
|---|---|---|---|
| JP | 2015-133420 A | | 7/2015 |
| JP | 2015133420 A | * | 7/2015 |
| JP | 2015-149361 A | | 8/2015 |

*Primary Examiner* — Raheena R Malik
(74) *Attorney, Agent, or Firm* — Oliff PLC

(57) ABSTRACT

A cooler includes a coolant flow path between a first cooling plate and a second cooling plate segmented into a plurality of flow path segments along a flow-path traverse direction. The plurality of flow path segments includes at least one first flow path segment and at least one second flow path segment. Each first flow path segment includes: a first inner plate partitioning an internal space thereof into a first space and a second space and having a first nozzle that jets the coolant from the first space toward the second cooling plate. Each second flow path segment includes: a second inner plate partitioning an internal space thereof into a first space and a second space and having a second nozzle that jets the coolant from the second space toward the first cooling plate. The first inner and second inner plates are aligned in the flow-path traverse direction.

6 Claims, 12 Drawing Sheets

(56) References Cited

U.S. PATENT DOCUMENTS 8,755,185 B2 * 6/2014 Chou ................. H01L 23/3735
165/80.4
2017/0154837 A1 * 6/2017 Sasaki ................ H01L 23/3736

* cited by examiner

DOUBLE-SIDED COOLER

TECHNICAL FIELD

The technique disclosed herein relates to a double-sided cooler in which coolant flows between a first cooling plate and a second cooling plate that face each other, and a heating element is attached to an outer surface of each cooling plate.

BACKGROUND

A type of a cooler for cooling semiconductor modules or electronic components is known. This cooler is configured to jet coolant toward an inner surface of a cooling plate where a heating element, such as a semiconductor module, is attached. This type of cooler is called an impinging jet cooler. An impinging jet type double-sided cooler in which a heating element is attached to an outer surface of each of two cooling plates facing each other, and that jets the coolant onto inner surfaces of the respective cooling plates has been proposed (for example, Japanese Patent Application Publication Nos. 2015-133420 and 2015-149361). Double-sided coolers in Japanese Patent Application Publication Nos. 2015-133420 and 2015-149361 are provided with the following structure. A coolant flow path between a pair of cooling plates facing each other is segmented into three layers in a normal direction of the cooling plates by two inner plates. Coolant is supplied to a space in the middle. The inner plates are provided with nozzles for jetting the coolant toward the outer cooling plates. The coolant, which is supplied to the space in the middle, is jetted, through the nozzles of the inner plates, toward the cooling plates facing the respective inner plates.

SUMMARY

Both double-sided coolers of Japanese Patent Application Publication Nos. 2015-133420 and 2015-149361 segment the space between the facing cooling plates into three layers in the normal direction of the cooling plates by the two inner plates, and the nozzles are provided on the respective inner plates. Due to this, a distance between the pair of cooling plates (thickness of the cooler) becomes large. The description herein provides a technique that reduces a thickness of an impinging jet type double-sided cooler.

A double-sided cooler disclosed herein may comprise: a first cooling plate and a second cooling plate that are opposing each other and between which coolant flows; heating elements each attached to an outer surface of a corresponding one of the first and second cooling plates; an inlet port for the coolant disposed on one end of the double-sided cooler as seen along a normal direction of the first cooling plate; and an outlet port for the coolant disposed on another end of the double-sided cooler as seen along the normal direction of the first cooling plate, wherein a coolant flow path between the first cooling plate and the second cooling plate is segmented into a plurality of flow path segments in a flow-path traverse direction orthogonal to both the normal direction and a flowing direction of the coolant flowing from the inlet port to the outlet port, the plurality of flow path segments includes at least one first flow path segment and at least one second flow path segment, each of the at least one first flow path segment comprises: a first inner plate partitioning an internal space of the first flow path segment into a first first-cooling-plate-side space on a first cooling plate side and a first second-cooling plate-side space on a second cooling plate side and comprising a first nozzle configured to jet the coolant from the first first-cooling-plate-side space toward the second cooling plate; and a first upstream closing plate closing the first second-cooling-plate-side space on an inlet port side of the first nozzle; and a first downstream closing plate closing the first first-cooling-plate-side space on an outlet port side of the first nozzle, each of the at least one second flow path segment comprises: a second inner plate partitioning an internal space of the second flow path segment into a second first-cooling-plate-side space on the first cooling plate side and a second second-cooling-plate-side space on the second cooling plate side and comprising a second nozzle configured to jet the coolant from the second second-cooling-plate-side space toward the first cooling plate; a second upstream closing plate closing the second first-cooling-plate-side space on the inlet port side of the second nozzle; and a second downstream closing plate closing the second second-cooling-plate-side space on the outlet port side of the second nozzle, and the first inner plate and the second inner plate are aligned in the flow-path traverse direction. Further details and improvements of the technique disclosed herein will be described in the below.

BRIEF DESCRIPTION OF DRAWINGS

FIG. 5A shows a schematic perspective view of a flow path segment 3a.

DETAILED DESCRIPTION

Figure 1:
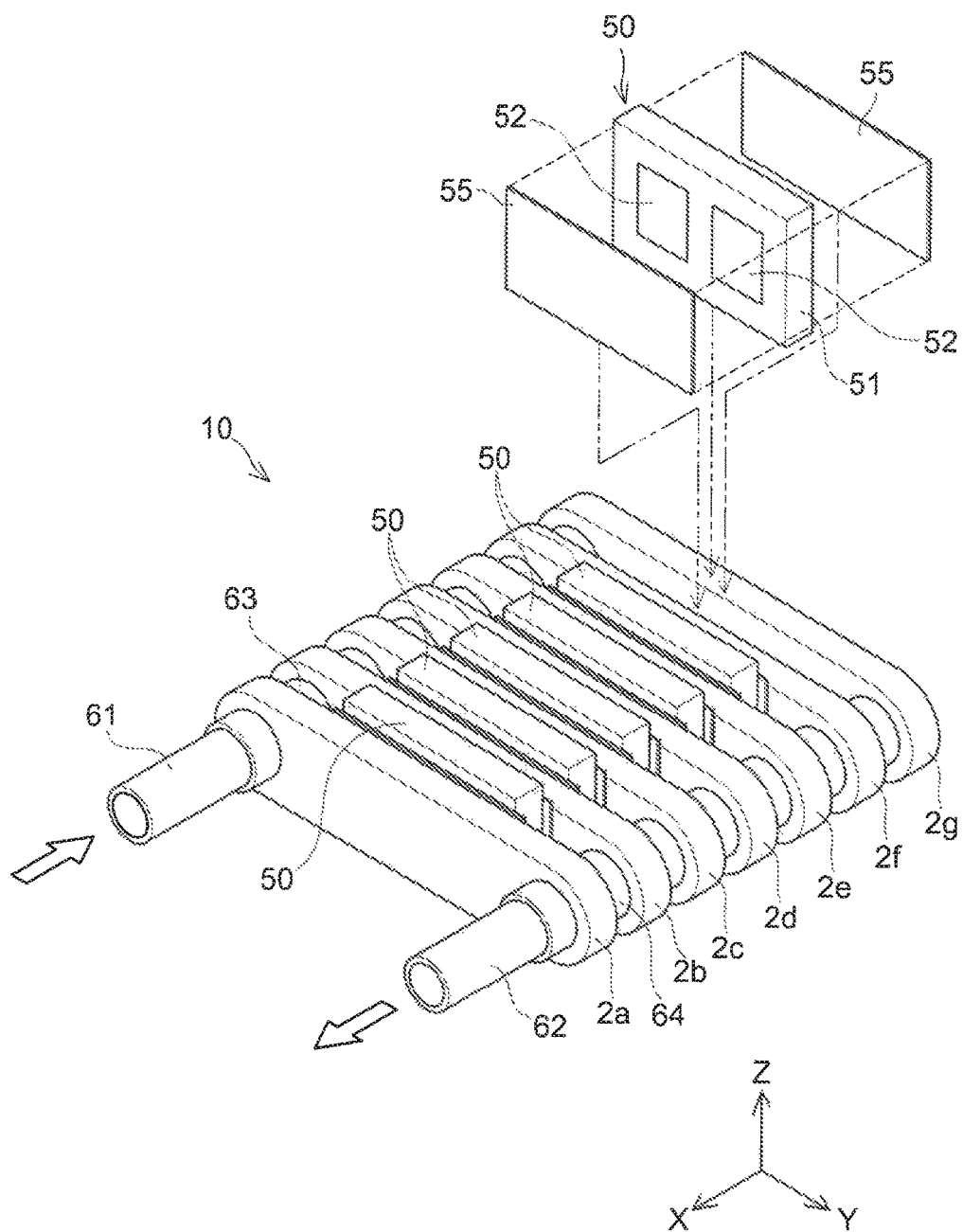
FIG. 1 shows a perspective view of a layered unit using coolers of an embodiment.

In the double-sided cooler disclosed herein, the coolant flow path is segmented into a plurality of narrow flow paths (flow path segments) in the flow-path traverse direction. In the at least one first flow path segment, the coolant is jetted toward the second cooling plate to increase cooling performance of the heating element attached to the second cooling plate, in the at least one second flow path segment, the coolant is jetted toward the first cooling plate to increase cooling performance of the heating element attached to the first cooling plate. In each of the first and second flow path segments, the space between the pair of cooling plates is segmented into two layers. In this double-sided cooler, the coolant flow path between the pair of cooling plates does not need to be segmented into three layers in the normal direction of the cooling plates. Due to this, a thickness of the double-sided cooler (distance between the pair of cooling plates) can be made small.

The double-sided cooler disclosed herein may further comprise the following feature. The coolant flow path is divided into an upstream past and a downstream part along the flowing direction, the upstream part in each of the at least one first flow path segment comprises: the first inner plate; the first upstream closing plate; and the first downstream closing plate, the downstream part in each of the at least one first flow path segment comprises: the second inner plate; the second upstream closing plate; and the second downstream closing plate, the upstream part in each of the at least one second flow path segment comprises: the second inner plate; the second upstream closing plate; and the second downstream closing plate, and the downstream part in each of the at least one second flow path segment comprises: the first inner plate; the first upstream closing plate; and the first downstream closing plate. Here, the first flow path segment in the upstream part of which the first inner plate is provided will be discussed. In the upstream part of the first flow path segment, the coolant is jetted toward the second cooling plate. The jetted coolant flows downstream along the second cooling plate. The coolant then flows into the second-cooling-plate-side space that is partitioned by the second inner plate provided in the downstream part thereof. Then, the coolant is jetted toward the first cooling plate on an opposite side. In the second flow path segment in the upstream part of which the second inner plate is provided, the coolant jetted toward the first cooling plate in the upstream part flows downstream along the first cooling plate. The coolant then flows into the first-cooling-plate-side space that is partitioned by the first inner plate provided in the downstream part. Then, the coolant is jetted toward the second cooling plate on an opposite side. In such a double-sided cooler, the coolant is jetted toward the cooling plates twice; that is, once in the upstream part, and once more in the downstream part. Furthermore, the coolant does not meander in the normal direction of the cooling plates when it flows from the upstream part to the downstream part of each flow path segment, and this allows the coolant to flow smoothly. Thus, an increase in losses in the flow path segments can be suppressed. The double-sided cooler having the above configuration can jet the coolant twice while suppressing the increase in the losses in the coolant flow path, and improvements in the cooling performance can further be expected.

Further, in the double-sided cooler that divided the coolant flow path into the upstream part and the downstream part, the coolant that had struck the first cooling plate in the upstream part strikes onto the second cooling plate in the downstream part. While on the other hand, the coolant that had struck the second cooling plate in the upstream part strikes onto the first cooling plate in the downstream part. This contributes to achieving the following advantage in cases where heat generating amounts differ between the heating element attached to the first cooling plate and the heating element attached to the second cooling plate. For example, a case where the heat generating amount of the heating element attached to the first cooling plate is greater than the heat generating amount of the heating element attached to the second cooling plate will be considered. The coolant that had struck onto the first cooling plate in the upstream part comes to have a higher temperature than the coolant that had struck onto the second cooling plate in the upstream part. In the downstream part thereof, the coolant with the higher temperature strikes onto the second cooling plate. On the other hand, the coolant of which temperature had risen only to the low temperature in the upstream part strikes onto the first cooling plate. Thus, the cooling performance for the heating element attached to the first cooling plate is increased. The coolant having the higher temperature at the time of flowing in the downstream part strikes onto the second cooling plate on which the heating element with the relatively smaller heat generating amount is attached. In the aforementioned double-sided cooler, in a case where the heat generating amounts of the heating elements on respective surfaces are different, the coolant with the lower temperature strikes onto the cooling plate with the larger heat generating amount. Thus, the double-sided cooler having the above structure can efficiently cool the heating elements on the respective surfaces.

In the double-sided cooler disclosed herein, further, a communicating space may be provided at a boundary between the upstream part and the downstream part, the communicating space communicating the flow path segments adjacent to each other in the flow-path traverse direction. In the communicating space, heat can be exchanged in the coolant in the flow path segments that are adjacent to each other. Thus, the coolant temperature can be uniformized in the downstream part.

In the double-sided cooler disclosed herein, the plurality of flow path segments may include a plurality of the first flow path segments and a plurality of the second flow path segments, and the first inner plates and the second inner plates may be alternately aligned in the flow-path traverse direction. According to this structure, the cooling performance along the flow-path traverse direction can further be uniformized.

First Embodiment

A double-sided cooler of embodiments will be described with reference to the drawings. Firstly, FIG. 1 shows a perspective view of a layered unit 10 that uses the double-sided cooler of an embodiment. The layered unit 10 is a unit in which a plurality of semiconductor modules 50 and a plurality of coolers 2a to 2g are stacked. In FIG. 1, one semiconductor module 50 from within the layered unit 10 is depicted with emphasis for easier understanding. A main body of the one semiconductor module 50 is a resin package 51 formed by resin injection molding, and two transistor chips are encapsulated in the resin package 51. The layered unit 10 is used as a primary component in a power converter such as a voltage converter or an inverter. Hereinbelow, the plurality of coolers 2a to 2g may in some cases be denoted cooler(s) 2, if they are to be indicated without the need to distinguish them.

Each semiconductor module 50 has a flat plate shape, and has heat sink plates 52 exposed on a wide-width surface of the resin package 51. Another set of heat sink plates is exposed on a wide-width surface on an opposite side as well, which cannot be seen in FIG. 1. The layered unit 10 has the plurality of coolers 2 aligned in parallel, and the semiconductor modules 50 are interposed between adjacent coolers. It should be noted that, an insulation plate 55 is interposed between each semiconductor module 50 and its adjacent cooler 2. Each semiconductor module 50 is cooled from its both surfaces.

The cooler 2a located at one end of the layered unit 10 in a layered direction is connected to a coolant supplying tube 61 and a coolant discharging tube 62. The adjacent coolers 2 are connected by two joint tubes (a supplying joint tube 63 and a discharging joint tube 64). Each cooler 2 has a coolant flow path provided inside, and the supplying joint tubes 63 and the discharging joint tubes 64 communicate the coolant flow paths of the adjacent coolers 2. The supplying joint tubes 63 are located on one side of the semiconductor modules 50, and the discharging joint tubes 64 are located on the other side of the semiconductor modules 50. The coolant supplying tube 61 and the supplying joint tubes 63 are arranged to overlap as seen along the layered direction (X direction in the drawings). The coolant discharging tube 62 and the discharging joint tubes 64 are similarly arranged to overlap as seen along the layered direction. The coolant supplying tube 61 and the coolant discharging tube 62 are connected to a coolant circulator that is not shown. Coolant supplied from the coolant circulator is distributed to all of the coolers 2 through the coolant supplying tube 61 and the supplying joint tubes 63. The coolant absorbs heat from the adjacent semiconductor modules 50 while it flows through coolant flow paths in the coolers 2. The coolant that had absorbed heat returns to the coolant circulator through the discharging joint tubes 64 and the coolant discharging tube 62. It should be noted that, the coolant is liquid, and may for example be water or LLC (Long Life Coolant).

The structure of the coolers 2 will be described with reference to FIGS. 2 to 6. It should be noted that, the semiconductor modules 50 being cooling targets make contact with both surfaces of each of the coolers 2b to 2f, except for the coolers 2a and 2g on both ends in the layered direction. Each of the coolers 2b to 2f is a double-sided cooler configured to cool heating elements attached to each of its two surfaces. Hereinbelow, the coolers 2b to 2f on both sides of which the semiconductor modules 50 make contact will be focused, and one of these coolers 2b to 2f will be denoted as a cooler 2.

Figure 2:
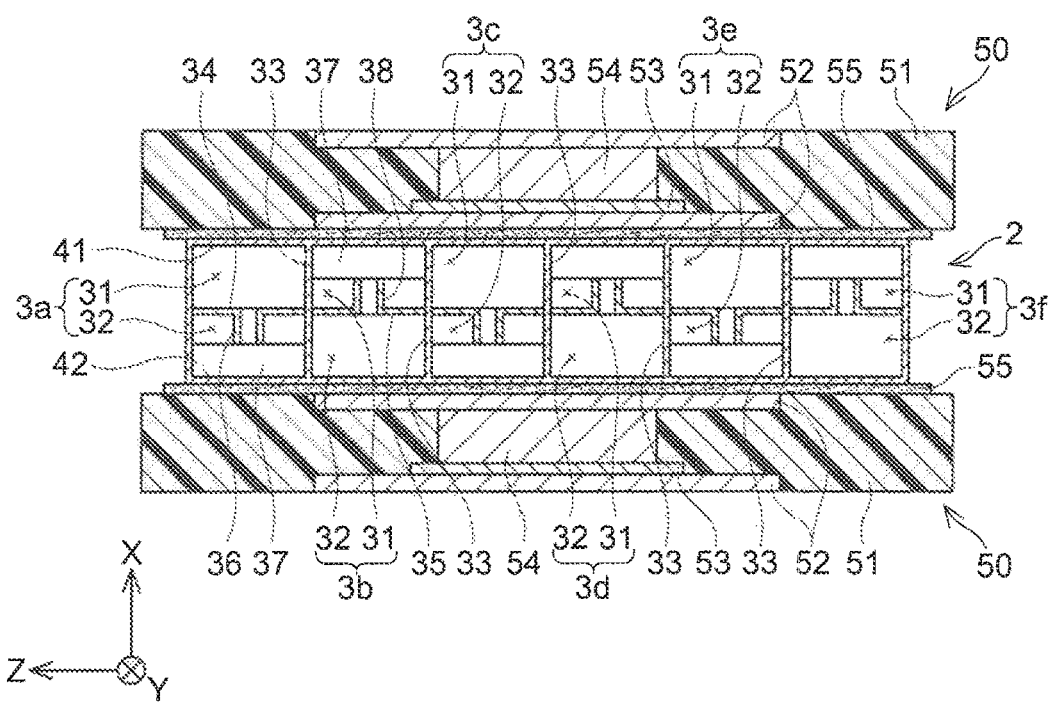
FIG. 2 is a cross-sectional view that cuts a cooler of a first embodiment and semiconductor module laminates on both sides thereof along an XZ plane of FIG. 1.
Figure 3:
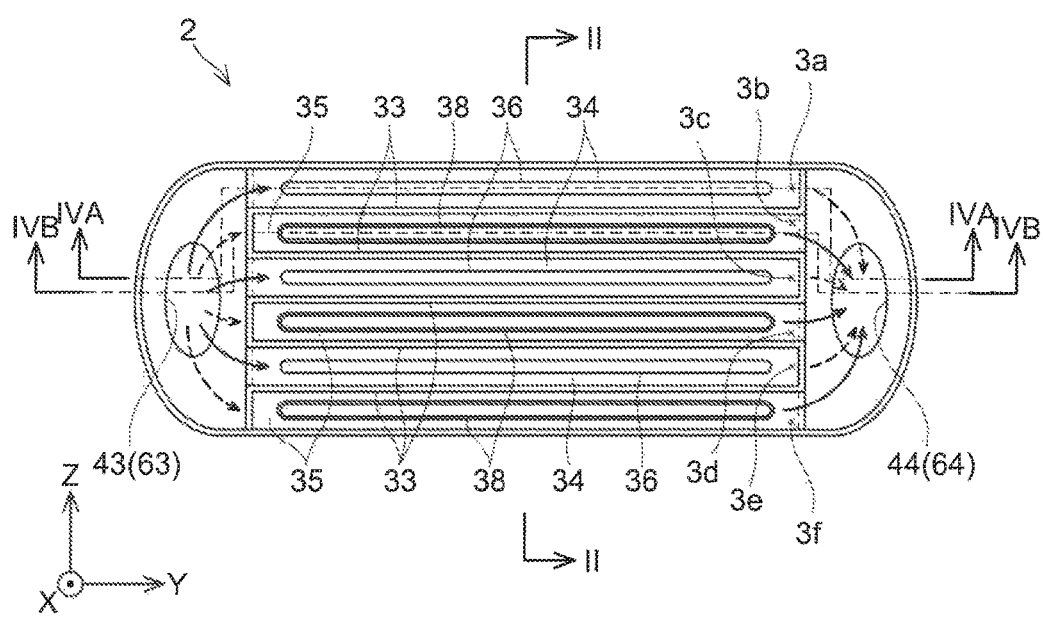
FIG. 3 is a plan view of the cooler with a first cooling plate detached therefrom.

FIG. 2 shows a cross sectional view that cuts a layered body including one cooler 2 and the semiconductor modules 50 on both sides thereof along an XZ plane of FIG. 1. The cooler 2 has a flat plate-like shape, and one semiconductor module 50 makes contact with each of outer surfaces of a pair of cooling plates facing each other (a first cooling plate 41 and a second cooling plate 42). The semiconductor modules 50 (more precisely, the transistor chips in those semiconductor modules 50) are heating elements being cooling targets. A space defined by the first cooling plate 41 and the second cooling plate 42 corresponds to a coolant flow path where the liquid coolant flows. FIG. 3 shows a plan view of the cooler 2 with its first cooling plate 41 detached. It should be noted that, FIG. 2 corresponds to a cross sectional view along a line II-II in FIG. 3.

As shown in FIG. 3, a coolant inlet port 43 is provided at one end of the cooler 2 along a Y direction of the drawings, and a coolant outlet port 44 is provided on the other end. The inlet port 43 is connected to the supplying joint tube 63 shown in FIG. 1, and the outlet port 44 is connected to the discharging joint tube 64. The coolant is supplied from the inlet port 43, flows in the coolant flow path in the cooler 2, and is discharged from the outlet port 44.

Figure 4A:
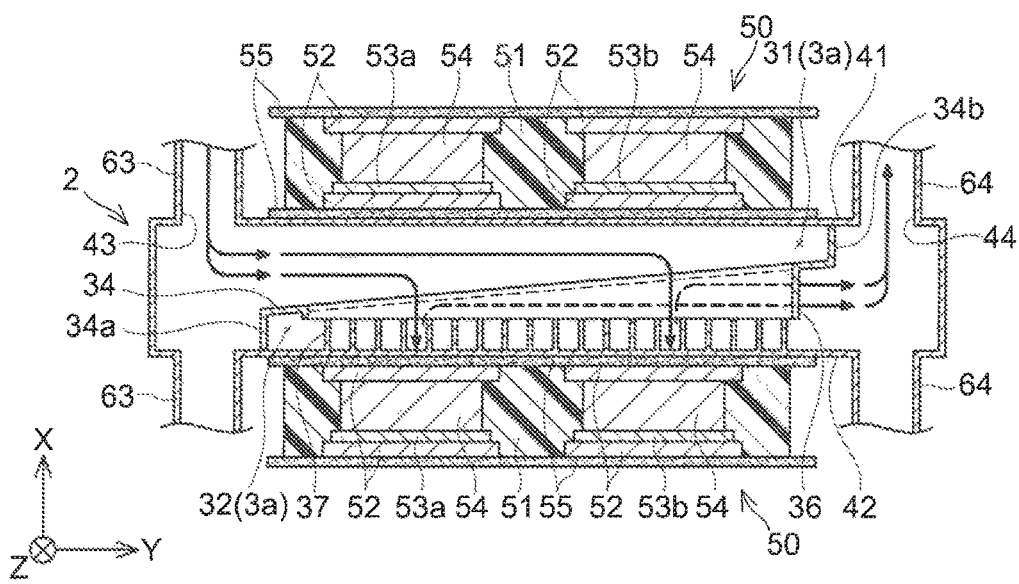
FIG. 4A is a cross-sectional view that cuts along a line IVA-IVA of FIG. 3.
Figure 4B:
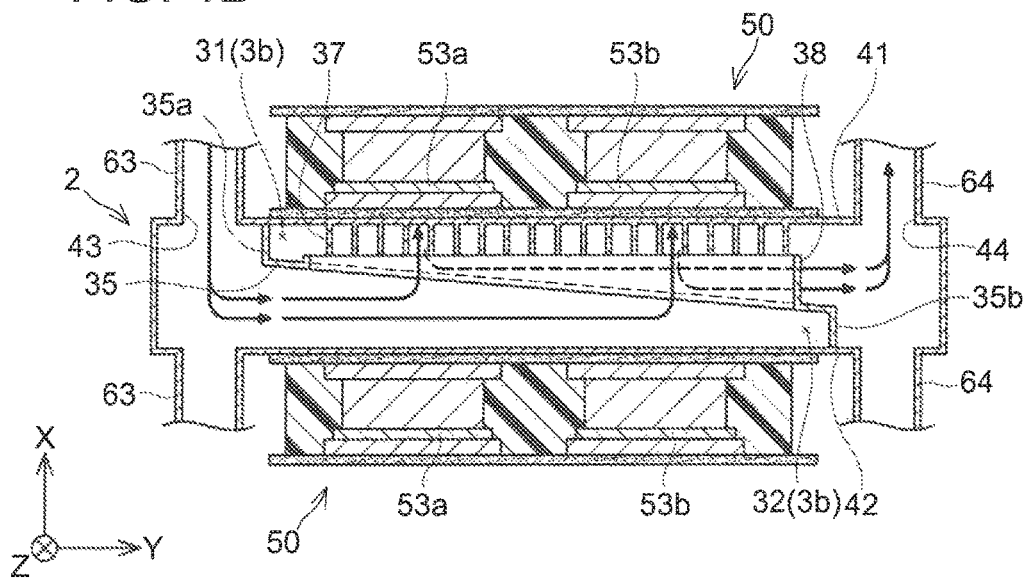
FIG. 4B is a cross-sectional view that cuts along a line IVB-IVB of FIG. 3.

The coolant flow path between the first cooling plate 41 and the second cooling plate 42 is segmented into a plurality of flow path segments 3a to 3f along a Z direction of the drawing by a plurality of partition plates 33. The flow path segments 3a to 3f extend along the Y direction of the drawing. FIGS. 4A and 4B show cross sectional views that cut the layered body in which the cooler 2 and the semiconductor modules 50 on both sides thereof are in contact with each other in the XY plane of FIG. 1. FIG. 4A corresponds to a cross section along a line IVA-IVA in the plan view of FIG. 3. FIG. 4B corresponds to a cross section along a line IVB-IVB in the plan view of FIG. 3. FIG. 4A corresponds to a cross section of the flow path segment 3a, and FIG. 4B corresponds to a cross section of the flow path segment 3b. It should be noted that, FIG. 2 enlarges the cooler 2 only along the Z direction for easier understanding.

The coolant flows from the inlet port 43 toward the outlet port 44. The Y direction in the drawings corresponds to a flowing direction of the coolant. The X direction corresponds to a normal direction of the first cooling plate 41 and the second cooling plate 42. A direction (Z direction) that is orthogonal to both the flowing direction (Y direction) and the normal direction (X direction) will be teamed a flow-path traverse direction. The coolant flow path between the first cooling plate 41 and the second cooling plate 42 is segmented into the plurality of flow path segments 3a to 3f along the flow-path traverse direction.

With reference to FIGS. 2 and 4, an internal structure of each semiconductor module 50 will be described first. The semiconductor module 50 encapsulates two transistor chips 53a, 53b inside its resin package 51. The transistor chips 53a, 53b have a flat plate shape, on one surfaces of which the heat sink plates 52 are connected, and on the other surfaces of which the other set of heat sink plates 52 are connected via copper blocks 54. Heat from the transistor chips 53a, 53b is transmitted to the heat sink plates 52 directly or through the copper blocks 54. The heat sink plates 52 are exposed on surfaces of the resin package 51, and are thermally in contact with the coolers 2 via the insulation plates 55. The heat from the transistor chips 53a, 53b is absorbed by the coolant that flows inside the coolers 2.

Figure 5A:
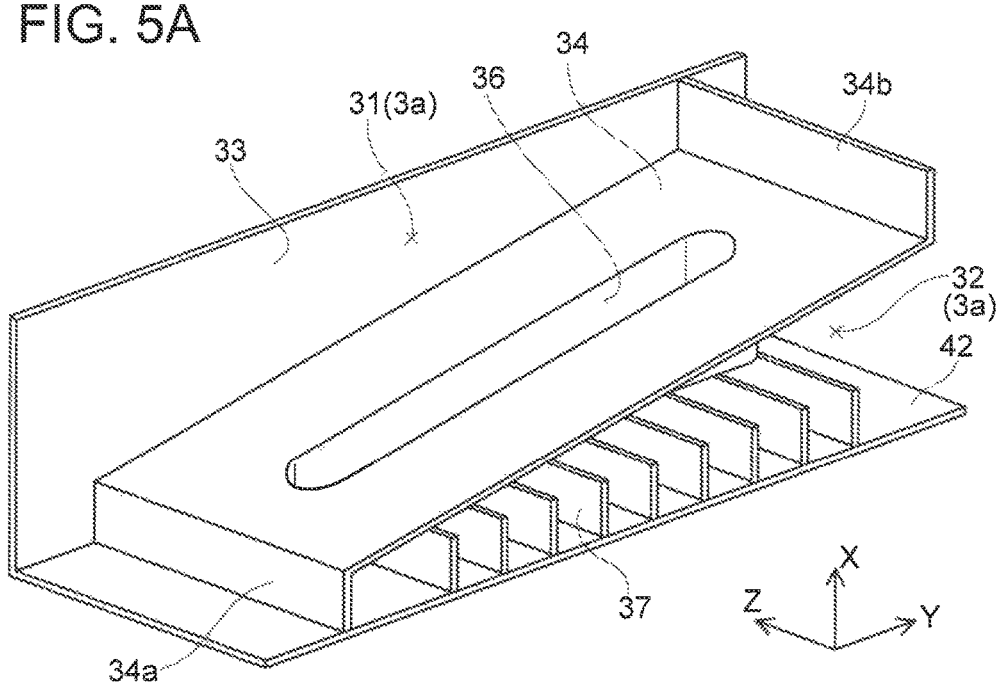

Next, an internal structure of the flow path segment 3a will be described primarily with reference to FIG. 4A. In FIG. 4A, bold line arrows show the coolant flow. Left side in the drawings corresponds to an upstream side of the coolant flow, and right side corresponds to a downstream side thereof. FIG. 5A shows a schematic perspective view of the flow path segment 3a for further reference. In FIG. 5A, the first cooling plate 41 and the partition plate 33 on a front side relative to a sheet surface along the Z direction are omitted.

The flow path segment 3a includes a first inner plate 34, a first upstream closing plate 34a, and a first downstream closing plate 34b therein. The first inner plate 34 partitions an internal space of the flow path segment 3a into a space on a first cooling plate 41 side (first space 31) and a space on a second cooling plate 42 side (second space 32). The first inner plate 34 includes a first nozzle 36 that is elongate along the flowing direction (see also FIG. 3). The first nozzle 36 protrudes from the first inner plate 34 toward the second cooling plate 42 (see also FIG. 2). A plurality of tins 37 is provided on the second cooling plate 42 in a range facing the nozzle 36. A tip of the first nozzle 36 is in contact with tips of the tins 37.

The first upstream closing plate 34a closes the second space 32 at an upstream side of the first nozzle 36 (that is, an inlet port 43 side). The first downstream closing plate 34b closes the first space 31 at a downstream side of the first nozzle 36 (that is, an outlet port 44 side).

Figure 6:
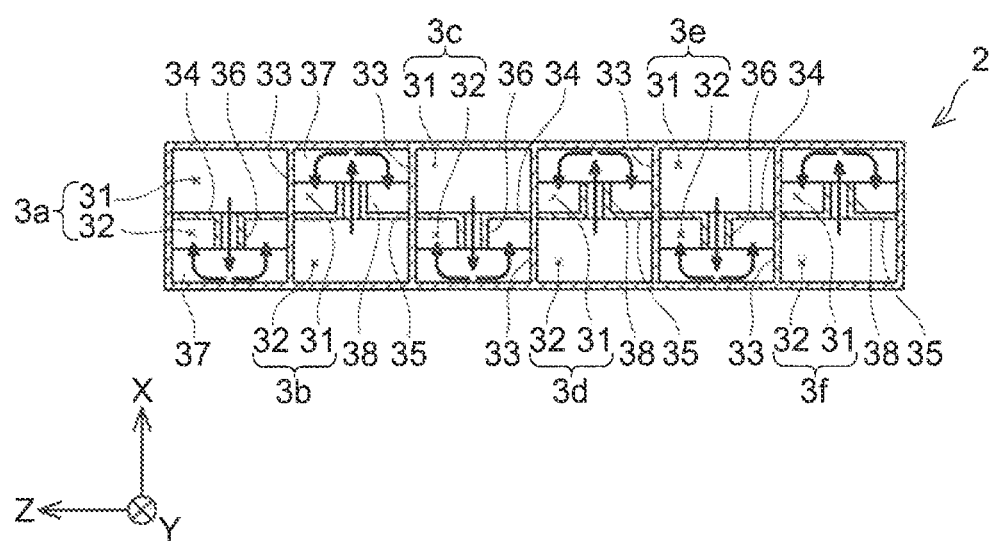
FIG. 6 is a cross-sectional view of the cooler corresponding to FIG. 2 for explaining coolant flow.

The coolant flow in the flow path segment 3a will be described. The coolant that entered from the coolant inlet port 43 flows into the first space 31. It should be noted that, an upstream end of the second space 32 is closed by the first upstream closing plate 34a, so the coolant that entered from the coolant inlet port 43 does not directly leak into the second space 32. The coolant that has proceeded to the first space 31 is jetted toward the second cooling plate 42 through the first nozzle 36. The coolant flows between the fins 37 adjacent to each other, and strikes onto the second cooling plate 42. The coolant that has splashed on the second cooling plate 42 flows outside the first nozzle 36, flows toward a downstream side in the second space 32, and is discharged from the coolant outlet port 44. It should be noted that, FIG. 6 shows a cross sectional view that schematically shows the coolant jetted from the nozzles 36 striking onto the cooling plates 41, 42 and splashing. FIG. 6 is a cross sectional view that omitted the semiconductor modules 50 in FIG. 2. Bold line arrows show the coolant flow.

In the flow path segment 3a, while progressing in the first space 31 along the first cooling plate 41, the coolant absorbs heat from the semiconductor module 50 on an upper side of FIG. 4A via the first cooling plate 41. During when the coolant is jetted through the first nozzle 36, flows between the fins 37 adjacent to each other, strikes onto the second cooling plate 42, and splashes, it absorbs heat from the semiconductor module 50 on a lower side of FIG. 4A via the second cooling plate 42 and the fins 37. The coolant generates turbulent flow by striking onto the second cooling plate 42. The turbulent flow generated in the coolant enhances heat absorption from the second cooling plate 42 and the fins 37. In the flow path segment 3a, a high cooling performance can be achieved for the semiconductor module 50 on the lower side of FIG. 4A by causing the coolant to strike onto the second cooling plate 42.

It should be noted that, in the flow path segment 3a, the first inner plate 34 is inclined relative to the first cooling plate 41 such that a cross sectional area of the path in the first space 31 becomes smaller towards the downstream side. This corresponds to a coolant amount in the first space 31 being reduced toward the downstream side.

Figure 5B:
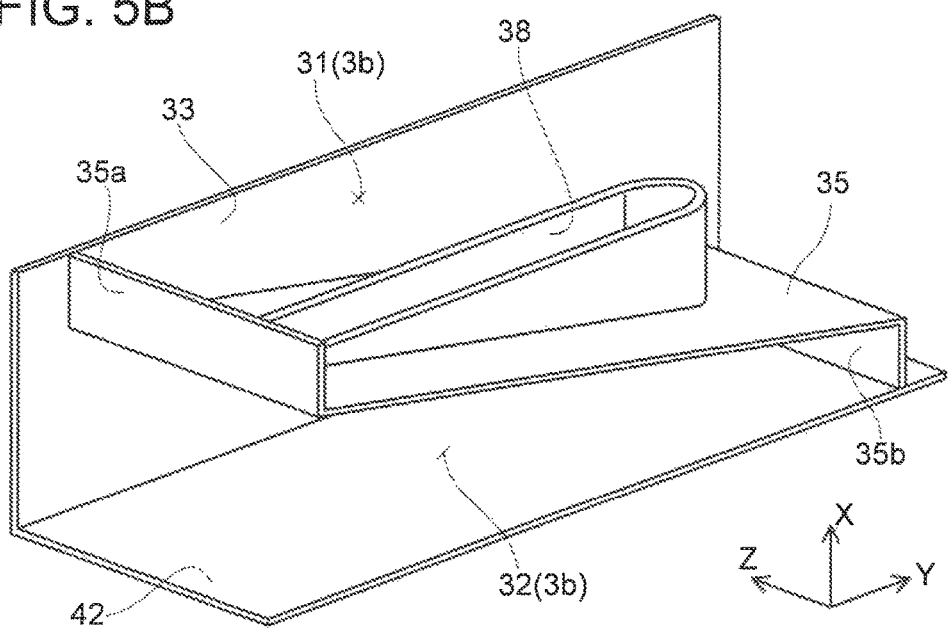
FIG. 5B shows a schematic perspective view of a flow path segment 3b.

Next, an internal structure of the flow path segment 3b will be described primarily with reference to FIG. 4B. In FIG. 4B, bold line arrows show the coolant flow, left side in the drawings corresponds to the upstream side of the coolant flow, and right side corresponds to the downstream side thereof. FIG. 5B shows a schematic perspective view of the flow path segment 3b for further reference. In FIG. 5B, the first cooling plate 41, the fins 37, and the partition plate 33 on the front side relative to the sheet surface along the Z direction are omitted. The flow path segment 3b has the structure in which the internal structure of the flow path segment 3a is inverted in the normal direction of the cooling plates 41, 42 (X direction).

The flow path segment 3b includes a second inner plate 35, a second upstream closing plate 35a, and a second downstream closing plate 35b therein. The second inner plate 35 partitions an internal space of the flow path segment 3b into a space on the first cooling plate 41 side (first place 31) and a space on the second cooling plate 42 side (second space 32). The second inner plate 35 includes a second nozzle 38 that is elongate along the flowing direction (see also FIG. 3). The second nozzle 38 protrudes from the second inner plate 35 toward the first cooling plate 41 (see also FIG. 2). A plurality of fins 37 is provided on the first cooling plate 41 in a range facing the second nozzle 38. A tip of the second nozzle 38 is in contact with tips of the fins 37.

The second upstream closing plate 35a closes the first space 31 at an upstream side of the second nozzle 38 (that is, the inlet port 43 side). The second downstream closing plate 35b closes the second space 32 at a downstream side of the second nozzle 38 (that is, the outlet port 44 side).

The coolant flow in the flow path segment 3b will be described. The coolant that entered from the coolant inlet port 43 flows into the second space 32. It should be noted that, an upstream end of the first space 31 is closed by the second upstream closing plate 35a, so the coolant that entered from the coolant inlet port 43 does not directly leak into the first space 31. The coolant that has proceeded to the second space 32 is jetted toward the first cooling plate 41 through the second nozzle 38. The coolant flows between the fins 37 adjacent to each other, and strikes onto the first cooling plate 41. The coolant splashes on the first cooling plate 41 (see FIG. 6). The coolant that has splashed on the first cooling plate 41 flows outside the second nozzle 38, flows toward the downstream side in the first space 31, and is discharged from the outlet port 44.

In the flow path segment 3b, while progressing iii the second space 32 along the second cooling plate 42, the coolant absorbs heat from the semiconductor module 50 on the lower side of FIG. 4B via the second cooling plate 42. During when the coolant is jetted through the second nozzle 38, flows between the fins 37 adjacent to each other, strikes onto the first cooling plate 41, and splashes, it absorbs heat from the semiconductor module 50 on the upper side of FIG. 4B via the first cooling plate 41 and the fins 37. The coolant generates turbulent flow by striking onto the first cooling plate 41. The turbulent flow generated in the coolant enhances heat absorption from the first cooling plate 41 and the fins 37. In the flow path segment 3b, a high cooling performance can be achieved for the semiconductor module 50 on the upper side in the drawings by causing the coolant to strike onto the first cooling plate 41.

In the flow path segment 3b, the second inner plate 35 is inclined such that a cross sectional area of the path in the second space 32 becomes smaller towards the downstream side. This corresponds to a coolant amount in the second space 32 being reduced toward the downstream side.

The flow path segment 3a provided with the first inner plate 34, the first upstream closing plate 34a, and the first downstream closing plate 34b configures an impinging jet cooler that jets the coolant toward the second cooling plate 42. The flow path segment 3b provided with the second inner plate 35, the second upstream closing plate 35a, and the second downstream closing plate 35b configures an impinging jet cooler that jets the coolant toward the first cooling plate 41. As shown in FIGS. 2 and 3, the first inner plate 34 is arranged in each of the flow path segments 3c, 3e similar to the flow path segment 3a. The second inner plate 35 is arranged in each of the flow path segments 3d, 3f similar to the flow path segment 3b. Although not shown on the drawing, the flow path segments 3c, 3e are each provided with the first upstream closing plate 34a and the first downstream closing plate 34b as well, similar to the flow path segment 3a. Further, the flow path segments 3d, 3f are each provided with the second upstream closing plate 35a and the second downstream closing plate 35b as well, similar to the flow path segment 3b. It should be noted that, in FIG. 2, reference signs are given to the inner plates and the nozzles in the flow path segments 3a, 3b only. Reference signs are omitted for inner plates and nozzles of the flow path segments 3c to 3f. In FIG. 6, which shows a same cross sectional view of the cooler 2 as FIG. 2, the reference signs are given to all of the flow path segments for reference.

The flow path segments 3a, 3c, 3e correspond to impinging jet coolers that jet the coolant toward the second cooling plate 42, and the flow path segments 3b, 3d, 3f correspond to impinging jet coolers that jet the coolant toward the first cooling plate 41. The cooler 2 of the embodiment segments the coolant flow path between the first and second cooling plates 41, 42 into a plurality of elongate impinging jet coolers, some of which are directed toward one cooling plate and rest of which are directed toward the other cooling plate to cool both surfaces. The cooler 2 of the embodiment does not need to segment the coolant flow path between a pair of cooling plates into three layers, and as such, a cooler thickness (a distance between the pair of cooling plates) can be made small.

As shown in FIG. 3, in the cooler 2, the first inner plates 34 and the second inner plates 35 are aligned along the flow-path traverse direction (Z direction in the drawings). Further, in the configuration of FIG. 3, more specifically the first inner plates 34 and the second inner plates 35 are aligned alternately in the flow-path traverse direction (Z direction) in the coolant flow path that is segmented into the plurality of flow path segments 3a to 3f. According to such an arrangement, cooling performance in the flow-path traverse direction (Z direction) is uniformized. In FIG. 3, solid line arrows extending from the inlet port 43 indicate the coolant flow that flows to a front side of the first inner plates 34 relative to the sheet surface along the X direction (being the first spaces 31). Broken line arrows extending from the inlet port 43 indicate the coolant flow that flows to a rear side of the second inner plates 35 relative to the sheet surface along the X direction (being the second spaces 32). The coolant that flows through the flow path segments 3a to 3f is jetted out from the nozzles as it flows, and moves to the spaces on an opposite side. In FIG. 3, solid line arrows directed toward the outlet port 44 indicate the coolant flow that flows out from a front side of the second inner plates 35 relative to the sheet surface in the X direction (being the first spaces 31). Broken line arrows directed toward the outlet port 44 indicate the coolant flow that flows out from a rear side of the first inner plates 34 relative to the sheet surface in the X direction (being the second spaces 32).

Figure 7A:
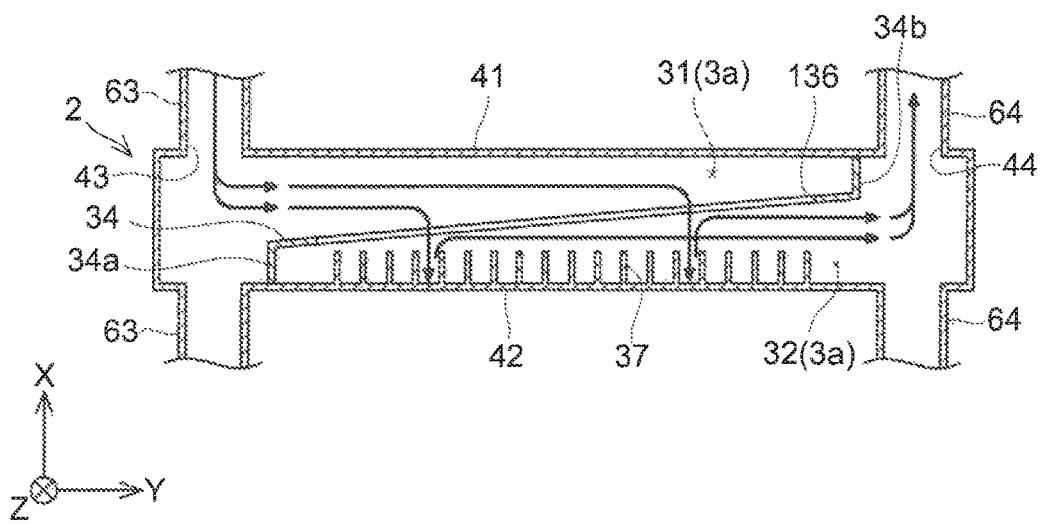
FIGS. 7A and 7B are cross-sectional views of a cooler of a variant.
Figure 7B:
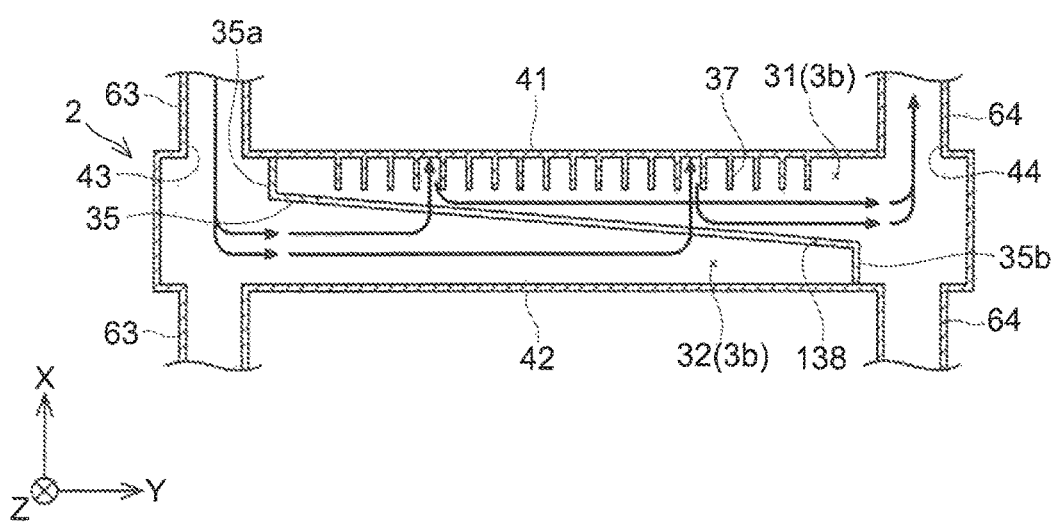

A first variant of the cooler 2 will be described with reference to FIG. 7. The cooler 2 of the first variant differs from the cooler 2 of FIGS. 2 to 5 in its nozzle shape. FIGS. 7A and 7B correspond to FIGS. 4A, 4B, respectively. That is, FIG. 7A is a cross sectional view of the flow path segment 3a, and FIG. 7B is a cross sectional view of the flow path segment 3b. It should be noted that, components being identical to components depicted in FIGS. 4A, 4B axe given same reference signs. Further, in FIGS. 7A and 7B, and in FIGS. 8A and 8B described later, depiction of the semiconductor modules 50 is omitted. In this variant, shapes of a first nozzle 136 provided on the first inner plate 34 and a second nozzle 138 provided on the second inner plate 35 differ from the nozzles of the embodiment. The first nozzle 136 and the second nozzle 138 are simple slits provided on the first inner plate 34 and the second inner plate 35, The nozzles are preferably cylindrical as in the first embodiment of FIGS. 2 to 5, however, they may simply be slits as in this variant.

Figure 8A:
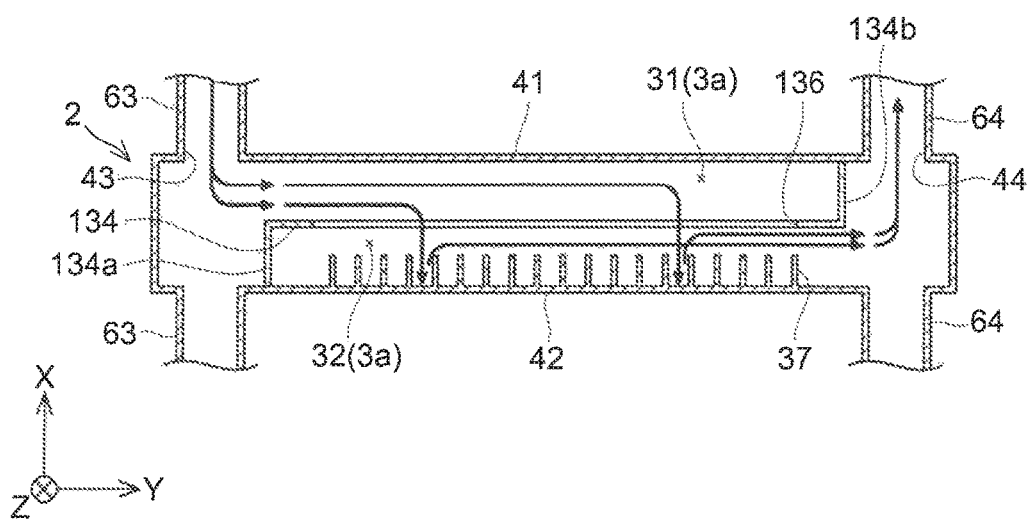
FIGS. 8A and 8B are cross-sectional views of a cooler of another variant.
Figure 8B:
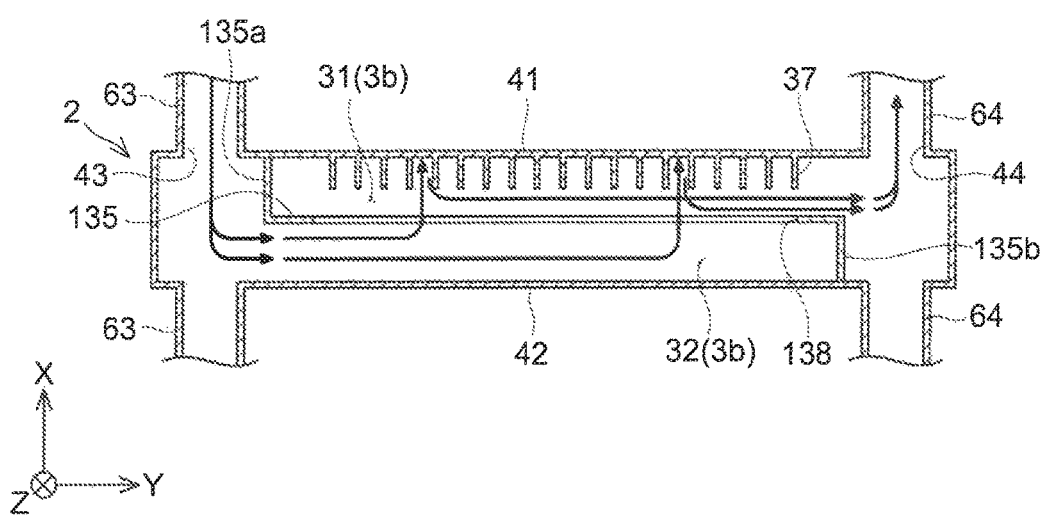

A second variant of the cooler 2 will be described with reference to FIGS. 8A and 8B. FIGS. 8A and 8B correspond to FIGS. 4A, 4B, respectively. That is, FIG. 8A is a cross sectional view of the flow path segment 3a, and FIG. 8B is a cross sectional view of the flow path segment 3b. It should be noted that, components being identical to components depicted in FIGS. 4A, 4B are given same reference signs. In this second variant, a first inner plate 134 and a second inner plate 135 are provided parallel to the first cooling plate 41 and the second cooling plate 42. It should be noted that, the first nozzle 136 and the second nozzle 138 are simple slits, similar to the variant of FIGS. 7A and 7B. The inner plates are preferably inclined similar to the inner plates (the first inner plate 34 and the second inner plate 35) of the first embodiment, however, they may be parallel to the first cooling plate 41 and the second cooling plate 42 as in this variant.

Second Embodiment

Figure 9A:
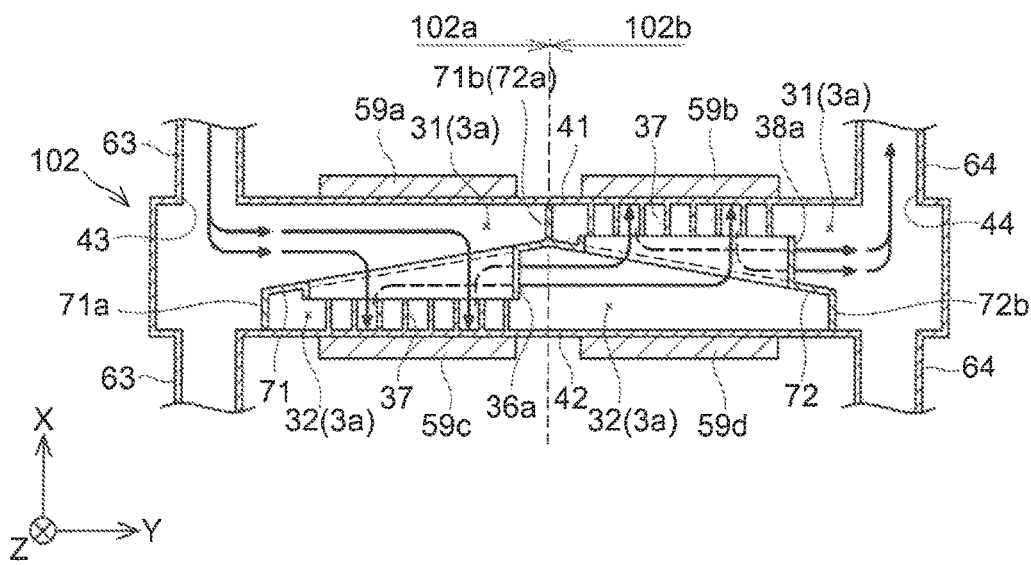
FIGS. 9A and 9B are cross-sectional views of a cooler of a second embodiment.
Figure 9B:
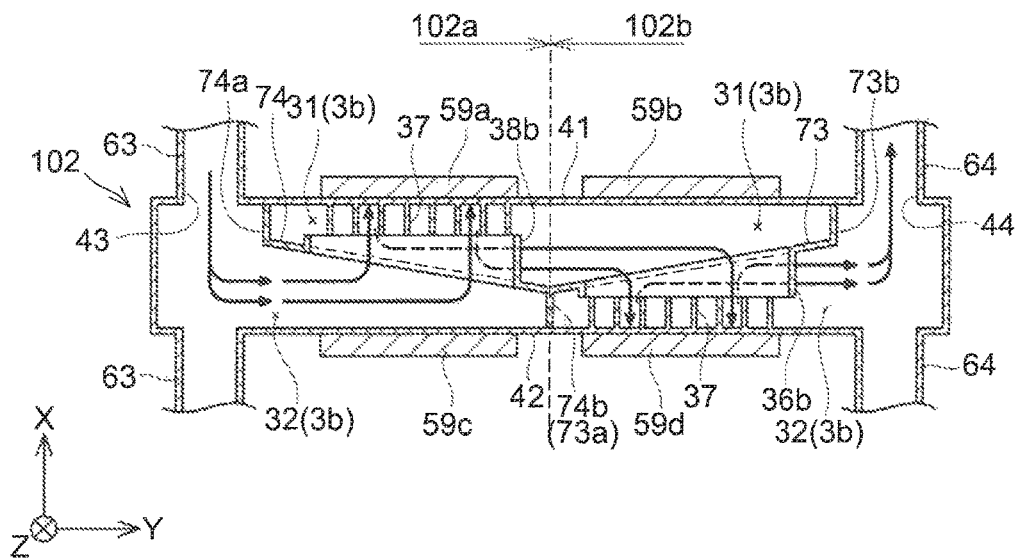

A cooler 102 of a second embodiment will be described with reference to FIGS. 9A and 9B. FIGS. 9A and 9B correspond to FIGS. 4A, 4B respectively. That is, FIG. 9A is a cross sectional view of the flow path segment 3a, and FIG. 9B is a cross sectional view of the flow path segment 3b. It should be noted that, components being identical to components depicted in FIGS. 4A, 4B are given same reference signs. Further, cooling targets are denoted as heating elements 59a to 59d. The heating elements 59a and 59b are attached to an outer side of the first cooling plate 41, and the heating elements 59c and 59d are attached to an outer side of the second cooling plate 42.

In the cooler 102 of the second embodiment, the coolant flow path from the inlet port 43 to the outlet port 44 is divided into an upstream part 102a and a downstream part 102b. It should be noted that, the cooler 102 has its coolant flow path segmented into the plurality of flow path segments 3a to 3f along the flow-path traverse direction similar to the previously described cooler 2. The flow path segments 3e and 3e have a same structure as the flow path segment 3a, and the flow path segments 3d and 3f have a same structure as the flow path segment 3b.

A structure of the flow path segment 3a of the cooler 102 will be described with reference to FIG. 9A. A first inner plate 71, a first upstream closing plate 71a, and a first downstream closing plate 71b are arranged in the upstream part 102a of the flow path segment 3a. Similar to the previously mentioned first inner plates 34, the first inner plate 71 partitions the space in the flow path segment 3a into the space on the first cooling plate 41 side (first space 31) and the space on the second cooling plate 42 side (second space 32). The first inner plate 71 is provided with a first nozzle 36a configured to jet the coolant from the first space 31 toward the second cooling plate 42. The first upstream closing plate 71a closes the second space 32 on an upstream side of the first nozzle 36a (that is, on the inlet port 43 side). The first downstream closing plate 71b closes the first space 31 on a downstream side of the first nozzle 36a (that is, on the outlet port 44 side). It should be noted that, the first downstream closing plate 71b serves also as a second upstream closing plate 72a to be described later. The upstream part 102a of the flow path segment 3a configures an impinging jet cooler that jets the coolant onto the second cooling plate 42.

A second inner plate 72, a second upstream closing plate 72a, and a second downstream closing plate 72b are arranged in the downstream part 102b of the flow path segment 3a. Similar to the previously mentioned second inner plate 35, the second inner plate 72 partitions the space in the flow path segment 3a into the space on the first cooling plate 41 side (first space 31) and the space on the second cooling plate 42 side (second space 32). The second inner plate 72 is provided with a second nozzle 38a configured to jet the coolant from the second space 32 toward the first cooling plate 41. The second upstream closing plate 72a closes the first space 31 on an upstream side of the second nozzle 38a (that is, on the inlet port 43 side). As aforementioned, the second upstream closing plate 72a serves also as the first downstream closing plate 71b. The second downstream closing plate 72b closes the second space 32 on a downstream side of the second nozzle 38*a* (that is, on the outlet port 44 side). The downstream part 102*b* of the flow path segment 3*a* configures an impinging jet cooler that jets the coolant onto the first cooling plate 41.

A structure of the flow path segment 3*b* will be described with reference to FIG. 9B. A second inner plate 74, a second upstream closing plate 74*a*, and a second downstream closing plate 74*b* are arranged in the upstream part 102*a* of the flow path segment 3*b*. Similar to the previously mentioned second inner plates 35, the second inner plate 74 partitions the space in the flow path segment 3*b* into the space on the first cooling plate 41 side (first space 31) and the space on the second cooling plate 42 side (second space 32). The second inner plate 74 is provided with a second nozzle 38*b* configured to jet the coolant from the second space 32 toward the first cooling plate 41. The second upstream closing plate 74*a* closes the first space 31 on an upstream side of the second nozzle 38*b* (that is, on the inlet port 43 side). The second downstream closing plate 74*b* closes the second space 32 on a downstream side of the second nozzle 38*b* (that is, on the outlet port 44 side). It should be noted that, the second downstream closing plate 74*b* serves also as a first upstream closing plate 73*a* to be described later. The upstream part 102*a* of the flow path segment 3*b* configures an impinging jet cooler that jets the coolant onto the first cooling plate 41.

A first inner plate 73, the first upstream closing plate 73*a*, and a first downstream closing plate 73*b* are arranged in the downstream part 102*b* of the flow path segment 3*b*. The first inner plate 73 partitions the space in the flow path segment 3*b* into the space on the first cooling plate 41 side (first space 31) and the space on the second cooling plate 42 side (second space 32). The first inner plate 73 is provided with a first nozzle 36*b* configured to jet the coolant from the first space 31 toward the second cooling plate 42. The first upstream closing plate 73*a* closes the second space 32 on an upstream side of the first nozzle 36*b* (that is, on the inlet port 43 side). As aforementioned, the first upstream closing plate 73*a* serves also as the second downstream closing plate 74*b*. The first downstream closing plate 73*b* closes the first space 31 on a downstream side of the first nozzle 36*b* (that is, on the outlet port 44 side). The downstream part 102*b* of the flow path segment 3*b* configures an impinging jet cooler that jets the coolant onto the second cooling plate 42.

The coolant flow in the flow path segment 3*a* of the cooler 102 will be described. The coolant that entered from the coolant inlet port 43 flows into the first space 31 partitioned by the first inner plate 71 in the upstream part 102*a* of the coolant flow path. The coolant flows through the first nozzle 36*a* of the first inner plate 71, proceeds to the second space 32, and strikes onto the second cooling plate 42. The coolant that has splashed on the second cooling plate 42 proceeds to the downstream part 102*b* outside the first nozzle 36*a*. In the downstream part 102*b*, it proceeds to the second space 32 partitioned by the second inner plate 72. The coolant is jetted into the first space 31 through the second nozzle 38*a* of the second inner plate 72, and strikes onto the first cooling plate 41. Then, the coolant is discharged outside the cooler 102 from the first space 31 in the downstream part 102*b* through the outlet port 44.

The coolant flow in the flow path segment 3*b* is an opposite of the coolant flow in the flow path segment 3*a*. In the flow path segment 3*b*, the coolant is jetted from the second space 32 on the second cooling plate 42 side onto the first cooling plate 41 through the second nozzle 38*b* of the second inner plate 74 in the upstream part 102*a*. The coolant that has splashed on the first cooling plate 41 moves within the first space 31 into the downstream part 102*b*. In the downstream part 102*b*, the coolant is jetted from the first space 31 on the first cooling plate 41 side onto the second cooling plate 42 through the first nozzle 36*b* of the first inner plate 73.

In each of the flow path segments 3*c*, 3*e*, similar to the flow path segment 3*a*, the first inner plate 71, the first upstream closing plate 71*a*, and the first downstream closing plate 71*b* are arranged in the upstream part 102*a*, and the second inner plate 72, the second upstream closing plate 72*a*, and the second downstream closing plate 72*b* are arranged in the downstream part 102*b*. In each of the flow path segments 3*d*, 3*f*, similar to the flow path segment 3*b*, the second inner plate 74, the second upstream closing plate 74*a*, and the second downstream closing plate 74*b* are arranged in the upstream part 102*a*, and the first inner plate 73, the first upstream closing plate 73*a*, and the first downstream closing plate 73*b* are arranged in the downstream part 102*b*. In the upstream part 102*a*, the first inner plates 71 and the second inner plates 74 are aligned in the flow-path traverse direction (Z direction), and in the downstream part 102*b*, the first inner plates 73 and the second inner plates 72 are aligned in the flow-path traverse direction (Z direction), In the upstream part 102*a*, the first inner plates 71 and the second inner plates 74 are arranged alternately in the flow-path traverse direction (Z direction), and in the downstream part 102*b* as well, the first inner plates 73 and the second inner plates 72 are arranged alternately in the flow-path traverse direction (Z direction).

The cooler 102 of the second embodiment has a structure in which two sets of the structure of the cooler 2 in the first embodiment are aligned in the coolant flowing direction (Y direction in the drawings). However, the second inner plates are arranged downstream of the first inner plates in the upstream part, and the first inner plates are arranged downstream of the second inner plates in the upstream part. This structure has the following advantage. In the cooler 102, lengths of the first nozzles 36*a* (36*b*) and the second nozzles 38*a* (38*b*) in the flowing direction are shortened to allow two nozzles to be arranged in the flowing direction. Due to this feature, pressure of the coolant jetted from each nozzle can be intensified. The intensified pressure of the coolant jetted from each nozzle can bring forth improvement in the cooling performance.

In the cooler 102 of the second embodiment, the coolant flows smoothly from the upstream part 102*a* to the downstream part 102*b*. That is, the coolant that was jetted from the first space 31 to the second space 32 (or from the second space 32 to the first space 31) in the upstream part is jetted from the second space 32 to the first space 31 (or from the first space 31 to the second space 32) in the downstream part Upon its movement from the upstream part 102*a* to the downstream part 102*b*, the coolant does not need to move in the normal direction of the cooling plates (X direction in the drawings). As such, increase in path resistance can be suppressed. In other words, in the cooler 102 of the second embodiment, increase in loss accompanying the movement of the coolant from the impinging jet cooler in the upstream part 102*a* to the impinging jet cooler in the downstream part 102*b* can be suppressed.

Further, the cooler 102 of the second embodiment achieves the following advantage when heat generating amounts are different between the heating elements 59*a*, 59*b* on the first cooling plate 41 side and the heating elements 59*c*, 59*d* on the second cooling plate 42 side. For example, it is assumed that the heat generating amount on the first cooling plate 41 side is greater than the heat generating amount on the second cooling plate 42 side. The coolant that was jetted toward the first cooling plate 41 upon flowing through its corresponding upstream part 102a comes to have a higher temperature than the coolant that was jetted toward the second cooling plate 42 upon flowing through its corresponding upstream part 102a. In the downstream part 102b, the coolant having the increased temperature is then jetted toward the second cooling plate 42, that is, toward the side with a relatively small heat generating amount. The coolant that was jetted toward the second cooling plate 42 in its corresponding upstream part 102a has a lower temperature than the coolant that was jetted to the first cooling plate 41 in its corresponding upstream part 102a. In the downstream part 102b, the coolant having the relatively low temperature is then jetted toward the first cooling plate 41, that is, toward the side with a relatively large heat generating amount. As above, in the downstream part 102b, the coolant having the relatively low temperature strikes onto the side with the relatively high heat generating amount in each segment. As such, when the heat generating amounts differ between the first cooling plate 41 side and the second cooling plate 42 side, the cooler 102 of the second embodiment provides greater cooling performance for the side with the large heat generating amount than for the side with the small heat generating amount.

Third Embodiment

Figure 10:
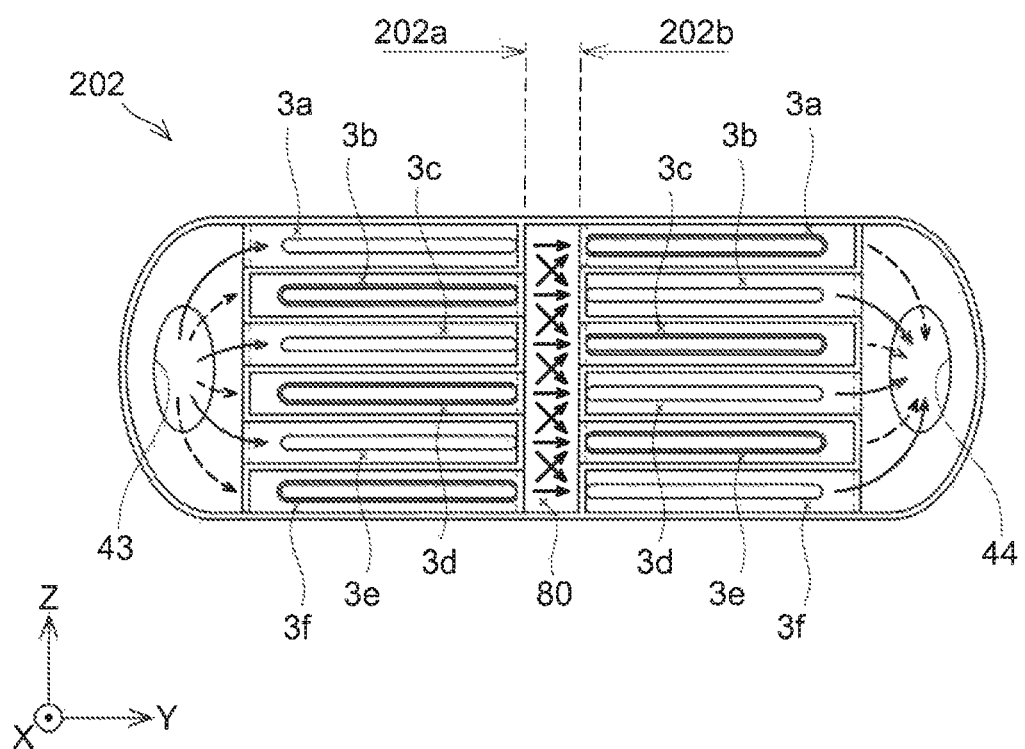
FIG. 10 is a plan view of a cooler of a third embodiment with a first cooling plate detached therefrom.
Figure 11A:
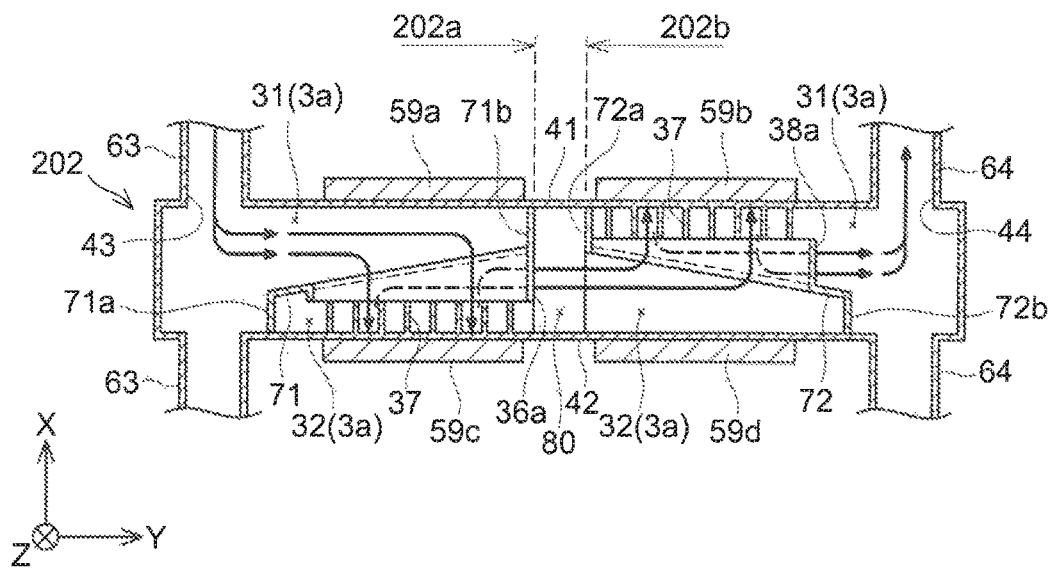
FIGS. 11A and 11B are cross-sectional views of the cooler of the third embodiment.
Figure 11B:
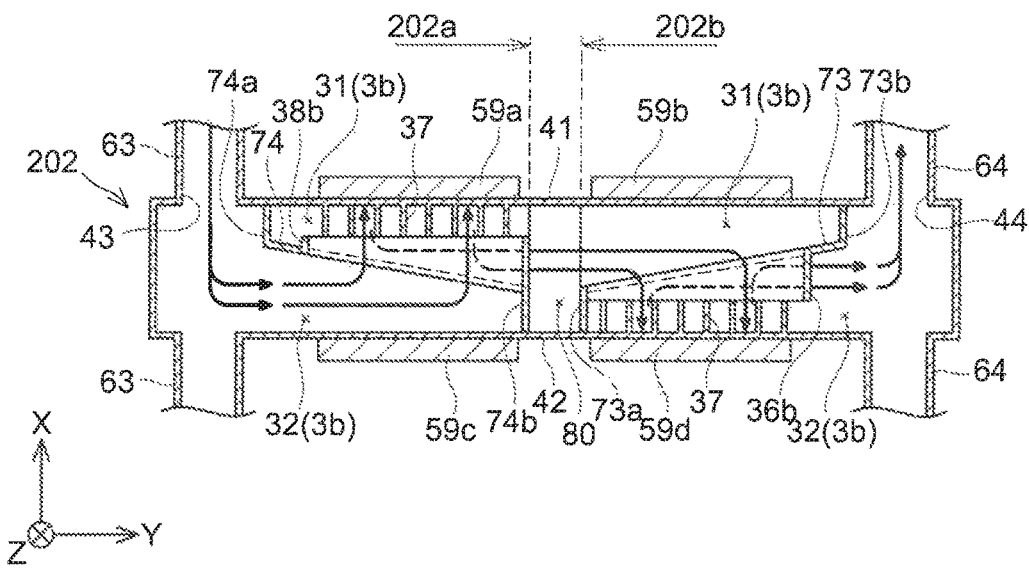

A cooler 202 of a third embodiment will be described with reference to FIGS. 10, 11A, and 11B. The cooler 202 is provided with a communicating space 80 between an upstream part 202a and a downstream part 202b. FIG. 10 is a plan view of the cooler 202 with the first cooling plate 41 detached therefrom. FIG. 11A is a cross sectional view of the flow path segment 3a, and FIG. 11B is a cross sectional view of the flow path segment 3b. FIG. 11A corresponds to FIG. 9A, and FIG. 11B corresponds to FIG. 9B. In FIGS. 11A, 11B, components being identical to components depicted in FIGS. 9A, 9B are given same reference signs. Description will be omitted for the components identical to those of FIG. 9. It should be noted that, in the flow path segment 3a of the cooler 202, it differs from the previously mentioned cooler 102 in that the first downstream closing plates 71b in the upstream part 202a do not serve as the second upstream closing plates 72a in the downstream part 202b. Similarly, the flow path segment 3b of the cooler 202 differs in that the second downstream closing plates 74b in the upstream part 202a do not serve as the first upstream closing plates 73a in the downstream part 202b.

In the communicating space 80, the flow path segments that are adjacent to each other in the flow-path traverse direction (Z direction in the drawings) communicate with each other. In the cooler 202, while the coolant moves from the upstream part 202a to the downstream part 202b, heat exchange in the coolant in the flow path segments that are adjacent to each other is enhanced in the communicating space 80. Due to this, the cooling performance on the first cooling plate 41 side and the cooling performance on the second cooling plate 42 side are uniformized in the downstream part 202b. Bold line arrows depicted in the communicating space 80 of FIG. 10 schematically show how the coolant mixes among the flow path segments that are adjacent to each other. It should be noted that, in the communicating space 80, there is no partition that separates the space on the first cooling plate 41 (first space 31) and the space on the second cooling plate 42 side (second space 32), so the heat exchange takes place also between those spaces.

As described above, the coolers 2, 102, 202 of the embodiments are impinging jet type double-sided coolers, and their coolant flow paths are each separated into two layers in the normal direction of the cooling plates. Being different from the conventional double-sided coolers in which the cooling passage is separated into three layers in the normal direction, they can reduce their cooler thickness in the normal direction.

Some of characteristic features of the cooler 2 are as follows. The cooler 2 has its flow path between the first cooling plate 41 and the second cooling plate 42 segmented into the plurality of flow path segments 3a to 3f along the flow-path traverse direction. The flow path segments 3a, 3c, 3e are each arranged with the first inner plate 34 that partitions the internal space thereof into the space on the first cooling plate 41 side (first space 31) and the space on the second cooling plate 42 side (second space 32). Each of the first inner plates 34 is provided with the first nozzle 36 configured to jet the coolant from the first space 31 onto the second cooling plate 42. Each of the flow path segments 3b, 3d, 3f is arranged with the second inner plate 35 that partitions the internal space thereof into the first space 31 and the second space 32. Each of the second inner plates 35 is provided with the second nozzle 38 configured to jet the coolant from the second space 32 onto the first cooling plate 41. The first inner plates 34 of the flow path segments 3a, 3c, 3e and the second inner plates 35 of the flow path segments 3b, 3d, 3f are aligned in the flow-path traverse direction (Z direction). The first inner plates 34 and the second inner plates 35 are arranged alternately in the flow-path traverse direction (Z direction). The flow path segments 3a, 3c, 3e correspond to the impinging jet coolers configured to jet the coolant toward the second cooling plate 42, and the flow path segments 3b, 3d, 3f correspond to the impinging jet coolers configured to jet the coolant toward the first cooling plate 41.

Some points for consideration regarding the techniques described in the embodiments will be described. In the coolers 2, 102, 202 of the embodiments, their coolant flow paths are each segmented into six flow path segments 3a to 3f along the flow-path traverse direction. A number of the flow path segments may be any number, so long as it is in plurality.

Figure 12:
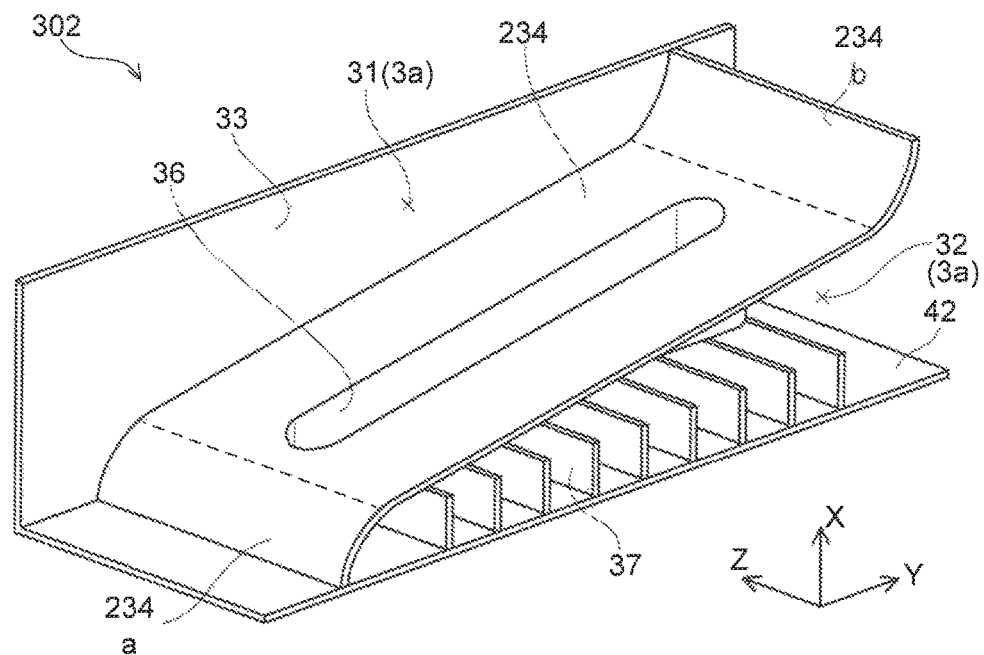
FIG. 12 is a schematic perspective view of a yet another variant.

In the coolers of the embodiments, each first upstream closing plate extends at a right angle from the second cooling plate, and each first downstream closing plate extends at a right angle from the first cooling plate. Each first upstream closing plate and each first downstream closing plate extend so as to be bent from the first inner plate. These first closing plates do not need to extend from the second cooling plate or the first cooling plate at right angles, and further, they do not need to extend so as to be bent from the first inner plate. FIG. 12 shows a schematic perspective view of the flow path segment 3a of a cooler 302, which is a variant. A first upstream closing plate 234a is curved, and it continues from a first inner plate 234 in a smooth curve. Similarly, a first downstream closing plate 234b is curved, and it continues from the first inner plate 234 in a smooth curve. A boundary between the first upstream closing plate 234a and the first inner plate 234 is not clearly defined, and a boundary between the first downstream closing plate 234b and the first inner plate 234 is also not clearly defined. It should be noted that, broken lines in FIG. 12 show virtual boundaries between the first upstream closing plate 234a (and the first downstream closing plate 234b) and the first inner plate 234. The techniques disclosed herein may employ the configuration of FIG. 12. Moreover, each first upstream closing plate and each first downstream closing plate may be level with their corresponding first inner plate. The same relationships apply to the second upstream closing plates, the second downstream closing plates, and the second inner plates.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously and satisfying any one of those objectives gives technical utility to the present invention.

What is claim is:

1. A double-sided cooler comprising:
   a first cooling plate and a second cooling plate opposing each other and configured to receive coolant in between;
   a plurality of heating elements, each heating element of the plurality of heating elements being attached to an outer surface of a corresponding one of the first cooling plate and the second cooling plate;
   an inlet port configured to pass the coolant, the inlet port being disposed on a first end of the double-sided cooler; and
   an outlet port configured to pass the coolant, the outlet port being disposed on a second end of the double-sided cooler,
   wherein:
   a coolant flow path between the first cooling plate and the second cooling plate is segmented into a plurality of flow path segments by a plurality of partition plates in contact with both the first cooling plate and the second cooling plate in a flow-path traverse direction that is orthogonal to both a normal direction of the first cooling plate and a flow direction of the coolant flowing from the inlet port to the outlet port,
   the plurality of flow path segments includes at least one first flow path segment and at least one second flow path segment independent from the at least one first flow path segment,
   each of the at least one first flow path segment includes:
      a first inner plate partitioning an internal space of the first flow path segment into a first first-cooling-plate-side space on a first cooling plate side and a first second-cooling plate-side space on a second cooling plate side, the first inner plate including a first nozzle configured to jet the coolant from the first first-cooling-plate-side space toward the second cooling plate;
      a first upstream closing plate closing the first second-cooling-plate-side space on an inlet port side of the first nozzle; and
      a first downstream closing plate closing the first first-cooling-plate-side space on an outlet port side of the first nozzle,
   each of the at least one second flow path segment includes:
      a second inner plate partitioning an internal space of the second flow path segment into a second first-cooling-plate-side space on the first cooling plate side and a second second-cooling-plate-side space on the second cooling plate side, the second inner plate including a second nozzle configured to jet the coolant from the second second-cooling-plate-side space toward the first cooling plate;
      a second upstream closing plate closing the second first-cooling-plate-side space on an inlet port side of the second nozzle; and
      a second downstream closing plate closing the second second-cooling-plate-side space on an outlet port side of the second nozzle, and
   the first inner plate and the second inner plate are aligned in the flow-path traverse direction.

2. The double-sided cooler according to claim 1, wherein:
   the coolant flow path is divided into an upstream part and a downstream part along the flow direction,
   the upstream part in each of the at least one first flow path segment includes:
      the first inner plate;
      the first upstream closing plate; and
      the first downstream closing plate,
   the downstream part in each of the at least one first flow path segment includes:
      the second inner plate;
      the second upstream closing plate; and
      the second downstream closing plate,
   the upstream part in each of the at least one second flow path segment includes:
      the second inner plate;
      the second upstream closing plate; and
      the second downstream closing plate, and
   the downstream part in each of the at least one second flow path segment includes:
      the first inner plate;
      the first upstream closing plate; and
      the first downstream closing plate.

3. The double-sided cooler according to claim 2, wherein a communicating space is disposed at a boundary between the upstream part and the downstream part, the communicating space communicating corresponding flow path segments of the plurality of flow path segments that are adjacent to each other in the flow-path traverse direction.

4. The double-sided cooler according to claim 1, wherein the plurality of flow path segments includes a plurality of the first flow path segments and a plurality of the second flow path segments, and
   the first inner plates and the second inner plates are aligned and alternating in the flow-path traverse direction.

5. The double-sided cooler according to claim 1, wherein the first flow path segment and the second flow path segment are divided into no more than two layers in the normal direction of the first cooling plate.

6. The double-sided cooler according to claim 1, wherein each flow path segment of the plurality of flow path segments includes only one of either the first inner plate or the second inner plate.

* * * * *